ELECTRICAL AMPLIFIER WITH INPUT CIRCUIT
DIRECT-CURRENT-LIMITING MEANS
Filed Sept. 7, 1965

INVENTORS.
WALTER B. MITCHELL
GEORGE L. BANNERMAN
BY
Curtis, Morris & Safford
ATTORNEYS United States Patent Office 3,317,671 Patented May 2, 1967

3,317,671
ELECTRICAL AMPLIFIER WITH INPUT CIRCUIT DIRECT-CURRENT-LIMITING MEANS

Walter B. Mitchell, Danbury, Conn., and George L. Bannerman, Yorktown, N.Y., assignors to National Semiconductor Corporation, Danbury, Conn.
Filed Sept. 7, 1965, Ser. No. 485,490
9 Claims. (Cl. 179—1)

This invention relates to high-gain semiconductor amplifiers with means for limiting the flow of direct current in the input circuit. More specifically, this invention relates to amplifier circuits used with microphones, and especially to hearing aid amplifiers; that is, to electrical amplifiers for amplifying human voice sounds received in a microphone and delivering them to a receiver device such as an ear-phone in the ear of the user.

The tiny microphones used in hearing aid devices usually are of the dynamic type. The flow of direct current through the coil of such a microphone must be either totally eliminated or made extremely small in order to prevent the microphone from becoming inoperative. In typical prior art hearing aid amplifiers, the flow of direct current through the coil of the microphone is blocked by connecting the coil to the amplifier through a relatively large input coupling capacitor.

One of the main objects of the present invention is to provide a very small and inexpensive amplifier with means for limiting the flow of direct current through the input circuit. Applicants, in making their invention, have recognized that the input coupling capacitor used in prior art amplifiers is a major obstacle to significant size and cost reductions for the amplifier. Accordingly, as one feature of their invention, applicants have provided an amplifier which does not use such a capacitor, and from which other capacitors have been eliminated so as to further simplify the amplifier and make it smaller and less expensive to produce.

Another problem encountered in prior art hearing aid amplifiers is that the internal impedance of the tiny batteries used to power the amplifier increases during the life of the battery. Deterioration of electrical contacts and other components of the hearing aid device increase the effective power supply impedance even further. With prior amplifier circuits, this changing impedance often produces low-frequency oscillation or "motor boating" which produces an objectionable audible noise and often overpowers the voice sounds desired to be heard. Certain prior amplifiers have been designed to avoid such oscillation, but those amplifiers are, for the most part, complicated and expensive. It is another object of the present invention to provide an amplifier in which such oscillation is eliminated in a simple, direct and inexpensive manner.

A further object of the present invention is to provide a hearing aid amplifier circuit in integrated circuit form.

Another object of the present invention is to provide such an amplifier which is relatively insensitive to changes in ambient temperature and other conditions.

The drawings and description that follow describe the invention and indicate some of the ways in which it can be used. In addition, some of the advantages provided by the invention will be pointed out.

Figure 1:
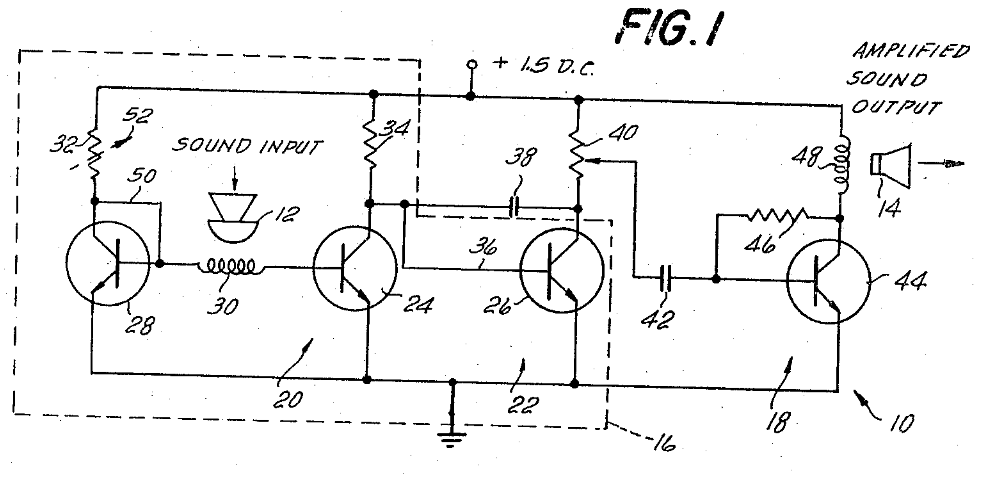
FIGURE 1 is a schematic circuit diagram of a hearing aid device constructed in accordance with the present invention.

Referring now to FIGURE 1, the hearing aid device includes an amplifier 10, a microphone 12, and a receiver 14. Amplifier 10 includes a bridge amplifier circuit 16 and a power amplifier circuit 18. Bridge amplifier circuit 16 includes two stages of amplification 20 and 22, each with a common-emitter-connected transistor 24 and 26. A third common-emitter-connected transistor 28 also is included in the bridge circuit 16.

The microphone 12 is of the magnetic type and includes a coil 30. It is not connected to the amplifier 10 by the usual large coupling capacitor since the present invention makes such a capacitor unnecessary. Instead, the end-terminals of coil 30 are connected directly to the base electrodes of transistors 20 and 28 which form opposite nodes of the bridge circuit 16. Bridge circuit 16 is balanced or nearly balanced with respect to direct currents so that the D.C. potential difference between the ends of coil 30 is very small and only a very small direct current flows through coil 30. Thus, the D.C. flow through the coil 30 is maintained at or below tolerable levels without the usual input coupling capacitor.

The collector electrode of transistor 28 is connected to a 1.5 volt D.C. supply through a resistor 32, and the collector electrode of transistor 24 is connected through an identical resistor 34 to the 1.5 volt D.C. source.

The emitters of all three transistors 24, 26 and 28 are connected together in a common-emitter-connection. Also, the base and collector electrodes of transistor 28 are connected together by a connection 50. The base electrode 36 of the transistor 26 is directly connected to the collector electrode of transistor 24, thus eliminating a coupling capacitor which commonly has been used in the past. A relatively small capacitor 38 is connected between the base and collector electrodes of transistor 26 in order to provide a sharply decreasing amplification of signals above approximately 7,500 cycles per second in frequency. As is well known in the art, a capacitor such as capacitor 38 prevents high-frequency "ringing" and other undesired high-frequency effects.

A volume control potentiometer 40 is connected between the 1.5 volt source and the collector electrode of transistor 26. In accordance with the prior art, the wiper arm of volume control potentiometer 40 is coupled through a relatively large capacitor 42 to the base electrode of a medium power transistor 44. Capacitor 42 determines the low-frequency "roll-off" or gain-frequency characteristic of the amplifier. A resistor 46 is connected between the base and collector electrodes of transistor 44, also in accordance with the prior art. Resistor 46 is used to establish the direct current flow through the coil 48 of receiver 14, which is connected between the 1.5 volt source and collector of transistor 44. Receiver 14 most commonly is an ear-phone which fits into the ear of the user.

Now considering the bridge circuit 16 in detail, its four branches are composed as follows: resistor 32 comprises one upper branch and resistor 34 comprises the other upper branch. The base-to-emitter path of transistor 28 provides a third branch, and the fourth branch is provided by the emitter-collector path of transistor 24 connected in parallel with the base-to-emitter path of transistor 26.

The D.C. voltages across the upper branches of this circuit are determined by resistors 32 and 34. The D.C. voltage across the third branch is the base-emitter voltage of transistor 28. The voltage across the fourth branch of the bridge circuit is the base-emitter voltage of transistor 26. Transistors 24, 26 and 28 are selected to be virtually identical to one another. Therefore, the base-emitter voltage of transistor 26 is very nearly the same as the base-emitter voltage of transistor 28 and the collector and base of transistor 24 are at about the same voltage as the collector and base of transistor 28 (which are connected together by lead 50 so as to have equal voltages). This substantially balances the bridge circuit 16. The base-emitter voltage of transistor 26 will be slightly different from that of transistor 28 because of the different level at which transistor 26 is operating. Therefore, as is indicated by the dashed arrow 52, resistor 32 may be varied to adjust this balance. This resistor 32 also is adjusted to set the bias point of transistor 26 accurately at approximately 0.75 volt D.C. in order to give maximum range of A.C. voltage variation in the circuit. A very small direct current flows through lead 50 and coil 30 to the bases of transistors 24 and 28 to provide them with bias current.

Advantageously, balancing transistor 28 serves not only to balance the D.C. voltage applied on the left terminal of coil 30, but it also serves to maintain the balanced condition of the bridge circuit 16 despite temperature or other ambient condition changes. Since its base-emitter voltage will vary in substantially the same way as the base-emitter voltage of transistors 24 and 26, the bridge circuit 16 will stay substantially in balance and the direct current through coil 30 will stay within limits despite such changes.

The alternating-current voice signals applied to the amplifier 10 by coil 30 are amplified by transistors 24, 26 and 44 substantially as if the left terminal of coil 30 were connected directly to the emitter lead of transistor 24. All of transistors 24, 26 and 28 are biased into conduction at all times by the D.C. bias system. Thus, the emitter-collector resistance is relatively low, and in effect conducts A.-C. signals directly to the emitter of transistor 24 by way of lead 50. Transistors 24, 26 and 44 are connected in cascade and amplify the A.-C. signals in a conventional manner. However, the amplifier 10, despite its simplicity and reliability, gives very high gain. For example, circuit 10 gives over 72 decibels gain with the use of standard silicon transistors.

The low-frequency oscillation or "motorboating" problem, as was discussed above, is thought to be due at least in part to increasing internal impedance in the circuit supplying the 1.5 volt D.C. signal. The amplifier circuit 10 has the advantage that it eliminates such oscillations due, it is believed, to the fact that low-frequency oscillation-inducing signals tend to be balanced out and rendered ineffective in the bridge circuit 16.

Figure 2:
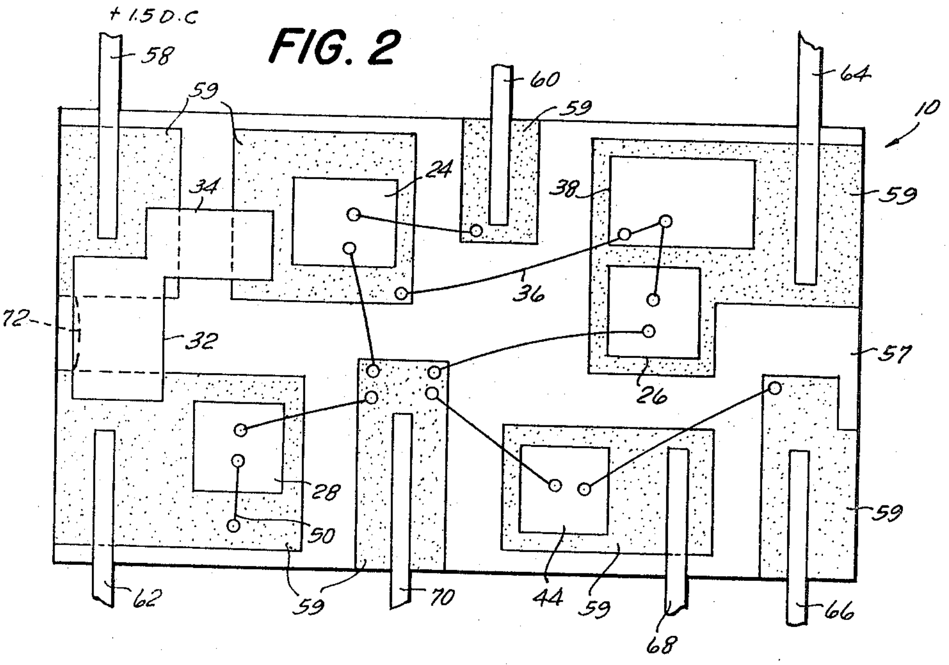
FIGURE 2 is a plan view of the amplifier of FIGURE 1 in "hybrid" integrated circuit form.

FIGURE 2 shows the amplifier 10 in "hybrid" integrated form. The hybrid circuit 10 comprises a ceramic insulating substrate or "chip" 57 upon the surface of which are formed several conductive regions 59 of thin metallic film. These areas are formed by conventional thin-film techniques such as silk-screening.

Transistors 24, 26, 28 and 44 are planar silicon transistors each of which is mounted in ohmic contact with one of the conductive areas 59. The collector electrode of the transistor thus is connected to the area 59 upon which the transistor is mounted and that area 59 then serves as the collector lead for the transistor.

Resistors 32 and 34 also are formed by well-known thin-film techniques. They are formed so as to contact appropriate conductive areas 59 to make proper circuit connections. Capacitor 38 is a well known metal-oxide-silicon capacitor which makes ohmic contact with the conductive layer upon which it is placed. Thin wires such as wire 36 are connected between appropriate circuit components by thermo-compression bonding. External leads 58, 60, 62, 64, 66, 68 and 70 are attached to appropriate conductive areas 59, and the assembly is "potted" or encapsulated in epoxy resin.

In accordance with one feature of the invention, the epoxy coating is not applied to all portions of resistor 32 at this time. Resistor 32 remains at least partially exposed so that its left edge can be cut away, preferably by well-known sand-blasting techniques, so as to increase its resistance to a value such as to set the collector bias voltage of transistor 26 at the desired level. The "trimmed" resistor 32 might, for example, have the shape indicated by dashed line 72. The resistor 32 is positioned near the edge of the ceramic chip 57 so as to facilitate this trimming process while protecting the other circuit components from grit and contaminants. After resistor 32 is trimmed, its epoxy coating is completed.

A number of the circuit components shown in FIGURE 1 are omitted from the integrated circuit shown in FIGURE 2 because it is preferred that they be added in later stages of assembly of the hearing aid device. For example, the 1.5 volt bias supply battery is connected between leads 58 and 70, and the microphone coil 30 is connected between terminals 60 and 62. The volume control potentiometer 40 is connected between leads 64 and 58, and the capacitor 42 is connected to lead 66 and to the wiper arm of the potentiometer. The resistor 46 is connected between leads 66 and 68, and the coil 48 of receiver 14 is connected between leads 58 and 68.

This arrangement has the advantage that hearing aids having a variety of different performances all can be made from the same basic mass-produced circuit 10. The values of capacitor 42 and resistor 46 can be selected to determine the low-frequency gain characteristic of the hearing aid and suit it to use by persons suffering from varying types and degrees of loss of hearing.

The very substantial advantage gained by the elimination of capacitors from amplifier 10 is readily apparent from an examination of FIGURE 2. The chip 57 is quite small; for example, only 0.125 by 0.225 inch. However, if the large input coupling capacitor were formed by the same techniques as the small capacitor 38, it would require vastly more surface area than the transistor 28 which replaces it. For example, if the coupling capacitor had a typical value of one microfarad, the capacitor would have to be at least two hundred times bigger than the whole chip 57. A tantalum capacitor usually is used for input coupling in prior amplifiers, but even a tantalum capacitor of one microfarad is about as big as the whole chip 57. In contrast to such expensive and massive prior art capacitors, the transistor 28 is very inexpensive and requires relatively little additional labor to assemble on the chip 57. Hence, the circuit chip 57 can be made considerably smaller and less expensively than if the coupling capacitor were required.

It should be understood that the circuit 10 also can be formed by monolithic and other integrated circuit techniques, in which the advantages of circuit 10 also are significant.

Figure 3:
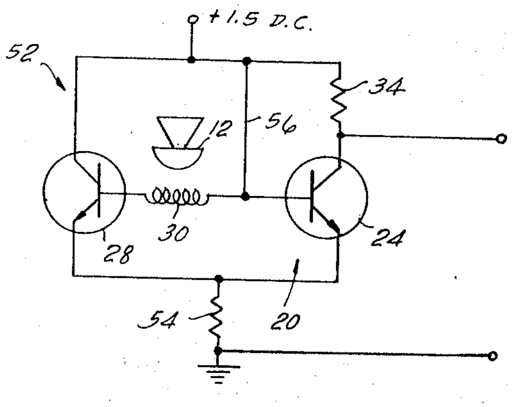
FIGURE 3 is a schematic circuit diagram of an alternative embodiment of the present invention.

FIGURE 3 shows an alternative amplifier circuit 52 constructed in accordance with the present invention. Only the first or balancing stage of the amplifier is shown since the remainder of the circuit is substantially the same as stages 18 and 22 in FIGURE 1. Corresponding elements in FIGURE 3 are given the same reference numerals as in FIGURE 1.

As in the circuit 10 shown in FIGURE 1, the D.C. potential on the right terminal of coil 30 is balanced by a substantially equal D.C. potential on the left terminal of the coil. The D.C. potential of the right terminal is fixed at supply potential (1.5 volts) by means of lead 56. A resistor 54 is connected between the emitters of transistors 24 and 28 and ground. The value of resistor 54 is selected so that the sum of the voltage drop across resistor 54 and the base-emitter voltage of either transistor 24 or 28 will equal the 1.5 bias voltage applied to the right terminal of coil 30. Thus, substantially equal D.C. voltages are applied at each terminal of coil 30 and the flow of D.C. through the coil is thus limited to a very small value.

Circuit 52 amplifies the A.C. input signals as a differential amplifier circuit, except that unlike an ordinary differential amplifier, the base and collector bias voltages of transistor 28 are the same, and the base bias of transistor 24 is higher than its collector voltage. This circuit 52 has the advantages of high input impedance, low output impedance, practically no base-collector leakage current in transistor 28 and lower power drain on the power supply. As in circuit 10, no input coupling capacitor is required, and the voltages on the end terminals of the coil 30 remain balanced despite ambient changes.

The above description of the invention is intended to be illustrative and not limiting. Various changes or modifications in the embodiments described may occur to those skilled in the art and these can be made without departing from the spirit or scope of the invention as set forth in the claims. For example, circuits other than those described above can be used to balance the D.C. potential across the microphone coil 30, and other temperature compensation means may be used.

We claim:

1. An integrated and miniaturized semiconductor amplifier for amplifying alternating current electrical signals, said amplifier comprising a wafer, an amplifier circuit integral with said wafer and including at least one semiconductor circuit element for amplifying said alternating current signals, input terminal means physically integral with said wafer and including at least two input terminals for receiving said alternating current signals and conducting them to said amplifier circuit, bias means physically integral with said wafer and electrically connected to said element for receiving and delivering a direct current bias voltage to said amplifier circuit, balancing means physically integral with said wafer and electrically connected to said element for establishing and maintaining the direct current potential of one of said input terminals at substantially the same level as the direct current potential of the other of said input terminals, and a microphone connected to said input terminals, said microphone being of the type which would be rendered substantially inoperative by the full flow of direct current through it.

2. Apparatus as in claim 1 in which said balancing means includes a second semiconductor circuit element whose electrical characteristics vary with ambient changes in substantially the same manner as the electrical characteristics of said one semiconductor circuit element.

3. Apparatus as in claim 2 in which said semiconductor elements are substantially identical transistors with their emitter electrodes connected together and including two substantially identical impedance elements each connected at one end to the collector electrode of one of said transistors and at the other end to the other of said impedance elements so as to form a bridge circuit, and a microphone connected between opposite nodes of said bridge circuit.

4. Apparatus as in claim 1 in which said semiconductor amplifier circuit means and said balancing means are interconnected so as to form a differential amplifier.

5. Apparatus as in claim 1 including an output amplification stage having a transistor element with a capacitor coupling its base electrode to receive the output signal of the preceding amplification apparatus, and a receiver connected to said output amplification stage.

6. A hearing aid amplifier, said amplifier comprising, in combination, two input terminals adapted to be connected to a magnetic type microphone, three substantially identical transistors, means for connecting one of said input terminals to the base electrode of a first one of said transistors and the other of said input terminals to the base electrode of a second one of said transistors, means connecting the emitter electrodes of said transistors to one another, three resistors, each of said resistors being connected at one end to the collector electrode of one of said transistors and at the other end to each of the other of said resistors, the base electrode of the third one of said transistors being connected to the collector electrode of said second transistor and means connecting said base electrode of said first transistor to said collector electrode of said first transistor.

7. An integrated circuit amplifier comprising, in combination, a wafer, a plurality of transistors including first and second similar transistors integral with said wafer, a pair of input terminals integral with said wafer, bias terminal means integral with said wafer for receiving direct current bias signals, means for connecting said bias terminal means to said transistors, and means for connecting each of said input terminals to the base terminal of a respective one of said first and second transistors, and means for interconnecting the collector and emitter electrodes of said first and second transistors for establishing and maintaining the direct current potential of one of said input terminals at substantially the same level as the direct current potential of the other of said input terminals, and, connected to said input terminals, a microphone which would be rendered substantially inoperative by the full flow of direct current through it.

8. Apparatus as in claim 7 in which said wafer is made of ceramic material and said transistors are secured to said wafer at one surface thereof, and including thin-film resistors integral with said wafer, said resistors being connected together and, at the opposite end of each, to the collector electrode of one of said first and second transistors, a third transistor having its base electrode connected to the collector electrode of one other of said transistors, each of said resistors forming an arm in a bridge circuit and the base-emitter junction of each of said first and second transistors each forming another arm in said bridge circuit, with the base electrodes of said first and second transistors being opposite nodes of said bridge circuit.

9. Apparatus as in claim 8 in which one of said resistors is positioned near one edge of said wafer to facilitate trimming, and including a solid plastic coating on said wafer surface.

References Cited by the Examiner

UNITED STATES PATENTS

| | | | |
|---|---|---|---|
| 3,018,445 | 1/1962 | Stone | 330—13 |
| 3,124,757 | 3/1964 | Heyser | 330—14 X |
| 3,153,203 | 10/1964 | Sem-Jacobsen | 330—30 |
| 3,209,083 | 9/1965 | Posen | 179—107 |
| 3,222,608 | 12/1965 | Chick | 330—117 X |

KATHLEEN H. CLAFFY, *Primary Examiner.*

R. P. TAYLOR, *Assistant Examiner.*